United States Patent
Wohlfarth

(10) Patent No.: US 6,396,706 B1
(45) Date of Patent: May 28, 2002

(54) SELF-HEATING CIRCUIT BOARD

(75) Inventor: Paul D. Wohlfarth, Vernonia, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/364,684

(22) Filed: Jul. 30, 1999

(51) Int. Cl.[7] .................................... H05K 7/06
(52) U.S. Cl. .................. 361/760; 361/771; 361/748; 361/750; 361/751; 361/794; 257/700; 257/701; 228/180.21; 228/180.1; 219/388
(58) Field of Search ................... 361/760, 771, 361/767, 748, 750, 751, 762, 794, 782; 174/260–263, 268; 257/700, 701, 723, 778; 228/180.21, 180.1, 123; 219/209, 388

(56) References Cited

U.S. PATENT DOCUMENTS

| | | | |
|---|---|---|---|
| 5,010,233 A | * | 4/1991 | Henschen et al. .......... 219/209 |
| 5,077,889 A | * | 1/1992 | Matsuda et al. .............. 29/612 |
| 5,435,378 A | * | 7/1995 | Heine et al. ................... 165/64 |
| 5,624,750 A | * | 4/1997 | Martinez et al. ............ 428/344 |
| 5,714,738 A | * | 2/1998 | Hauschulz et al. ......... 219/535 |
| 5,955,781 A | * | 9/1999 | Joshi et al. .................. 257/712 |
| 6,031,729 A | * | 2/2000 | Berkely et al. ............. 361/771 |

* cited by examiner

Primary Examiner—Darren Schuberg
Assistant Examiner—David Foster
(74) Attorney, Agent, or Firm—Daniel J. Bedell; Smith-Hill and Bedell

(57) ABSTRACT

Separate heating elements are embedded in a printed circuit board near integrated circuit (IC) packages or other parts mounted on the circuit board. Each heating element supplies heat to the part residing near it in response to an input voltage pulse. The heating elements are used to selectively melt solder or adhesives attaching the parts to the circuit board so that they can be easily removed or to temporarily melt solder or cure adhesive when the parts are mounted on the circuit board. The heating elements are also used to supply heat to IC packages for regulating their operating temperatures.

12 Claims, 3 Drawing Sheets

Figure 6:
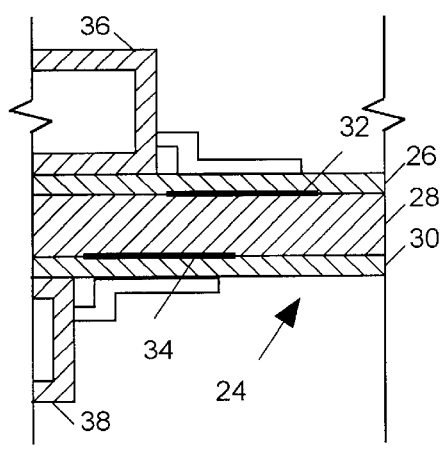

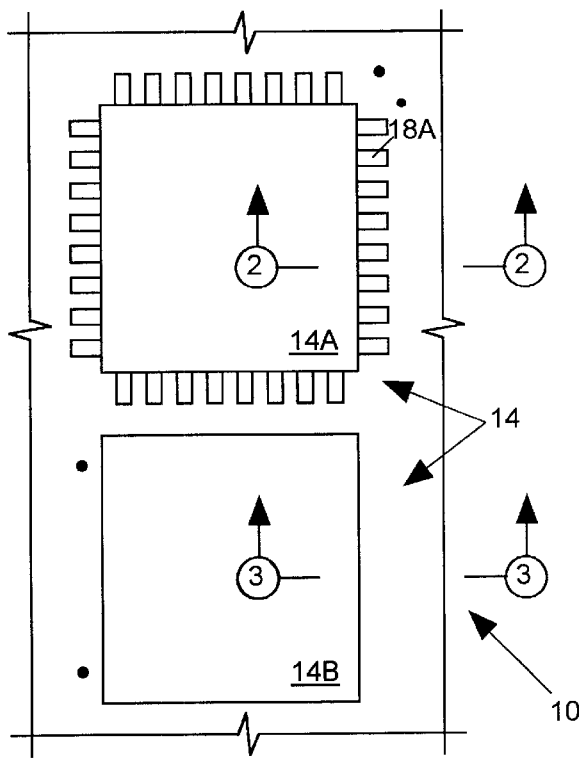
FIG. 1
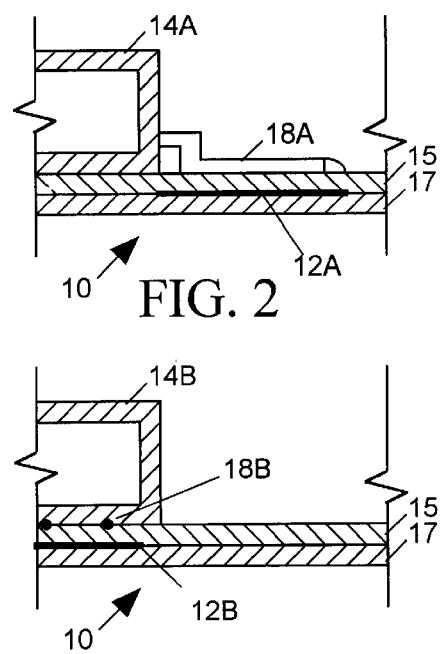
FIG. 2
FIG. 3
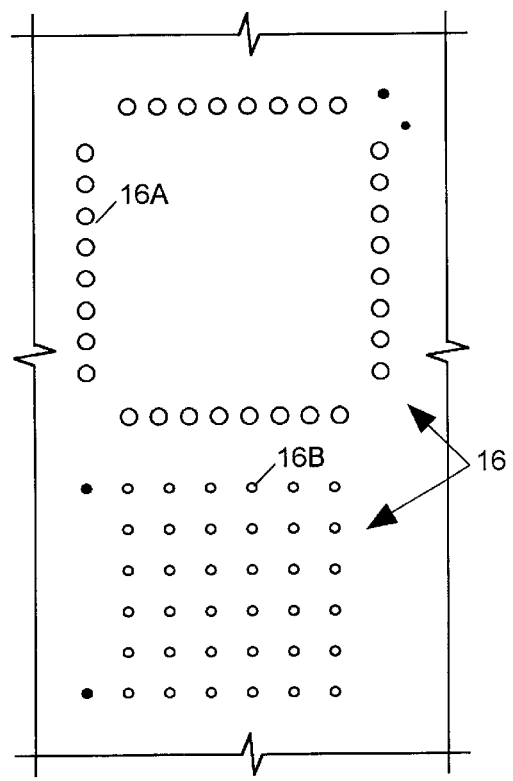
FIG. 4
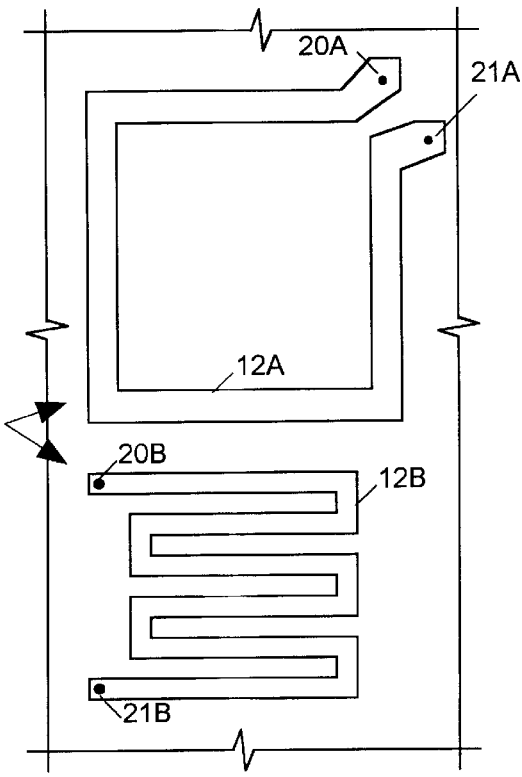
FIG. 5

SELF-HEATING CIRCUIT BOARD

CROSS-REFERENCE TO RELATED APPLICATION

The present application relates to subject matter disclosed in copending U.S. patent application Ser. No. 09/364,683 filed concurrently herein.

BACKGROUND OF THE INVENTION

1. Field of the Invention

The present invention relates in general to printed circuit boards and in particular to a circuit board having embedded heaters.

2. Description of Related Art

Integrated circuits (IC) are often attached to a printed circuit board by soldering the IC leads to pads on the surface of the board. Other parts such as discrete components, IC sockets, connectors and heat sinks are also typically soldered to pads on a printed circuit board. In order to replace a part soldered to a circuit board with a new part we melt the solder attaching the old part to the circuit board so that the part can be removed, and then solder the new part in its place. However solder connecting a part to a circuit board may not be readily assessable to a heating element; the solder may be in an area between closely spaced parts, may be covered by another part such as a heat shield, or may be covered by the part itself. For example a "ball-grid" IC package is attached to a circuit board via an array of solder balls on the underside of the package. It is possible to melt solder attaching a part to a circuit board by heating the entire part, but the heat needed to melt the solder can sometimes damage the part. It is also possible to heat solder attaching a part to the top of a circuit board by applying heat to the under side of the circuit board below the solder. However this may be difficult to do when the circuit board is thick or when the under side of the circuit board is covered with other parts, as is the case for a double-sided circuit board. It can also be difficult to melt solder holding one part to a densely packed circuit board without melting solder holding other nearby parts to the circuit board.

The operating speed of transistors in an IC implemented in complementary metal-oxide semiconductor (CMOS) technology or other semiconductor technologies is highly dependent on the operating temperature of the IC. Therefore in order to stabilize the operating speed of a CMOS or other type of IC, it has been known link the IC to a controllable heat source, to monitor the temperature of an IC or the switching speed of transistors implemented on the IC, and to control the amount of heat the source provides to the IC so as to maintain its temperature or at a constant level. However prior art systems for doing this have relied on bulky and expensive external heaters to-supply the heat to the IC.

What is needed is a heating system for selectively applying heat to solder connecting individual parts to a circuit board when the solder is not readily accessible to an external heat source. The heating system should also be able to provide heat to the parts for regulating their operating temperature.

SUMMARY OF THE INVENTION

A circuit board in accordance with the present invention includes one or more embedded heating elements for generating heat. The circuit board includes a thin upper layer of insulating material upon which parts such as integrated circuits, connectors and other devices are mounted and the heating element, residing below the upper layer and formed of material such as copper nichrome that generates substantial heat when conducting current. When a voltage pulse is applied across the heating element, a resulting current pulse passes through the heating element causing it to produce a pulse of heat.

In accordance with one aspect of the invention each heating element is positioned below a corresponding integrated circuit or other part that is soldered to the upper layer. The heat the heating element produces is used to temporarily melt solder attaching the part to the upper layer so that it can be easily removed or to temporarily melt the solder when the part is being mounted on the upper layer.

In accordance with another aspect of the invention each heating element is used as a heat source for regulating the temperature of the part mounted on the circuit board above the heating element.

In accordance with a further aspect of the invention, in one embodiment thereof, each heating element is a separate segment of a grid of heating conductors embedded under the upper layer. A voltage pulse applied across the entire grid can be used to supply a pulse of heat to all of the parts mounted on the circuit board. However a voltage pulse applied across only a particular segment of the grid produces substantial current only in that segment of the grid. In such case the grid supplies a substantial heat pulse only to those parts mounted on the circuit board above the segment of the grid that received the voltage pulse. Accordingly the grid can supply heat concurrently to all parts mounted on the circuit board or independently to particular subsets the parts.

It is accordingly an object of the invention to provide an inexpensive and convenient means,for selectively applying heat to parts mounted on a circuit board even when the parts are not readily accessible to an external heat source.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 7:
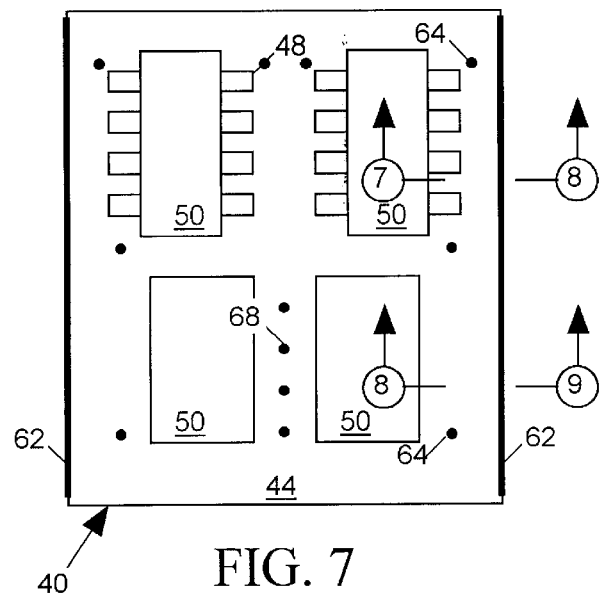
Figure 8:
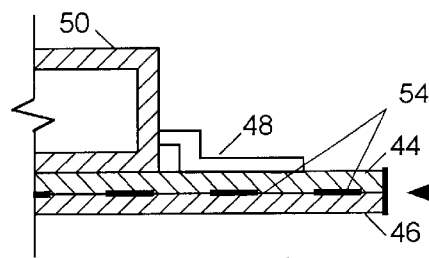
Figure 9:
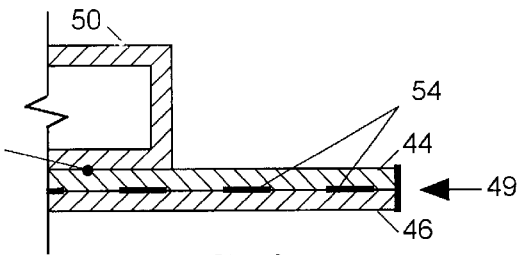
Figure 10:
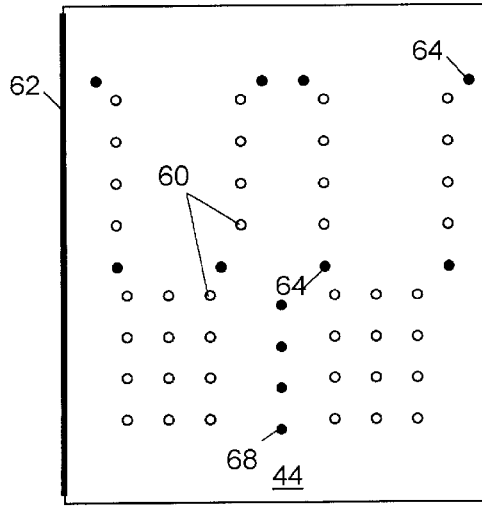
Figure 11:
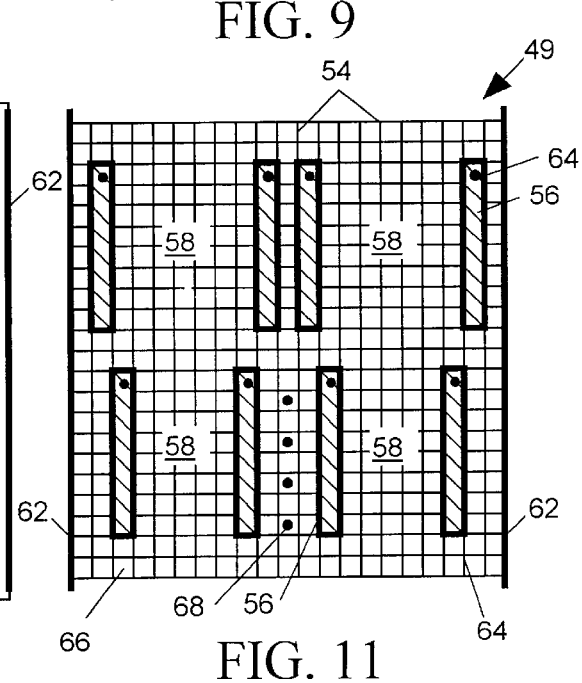
Figure 12:
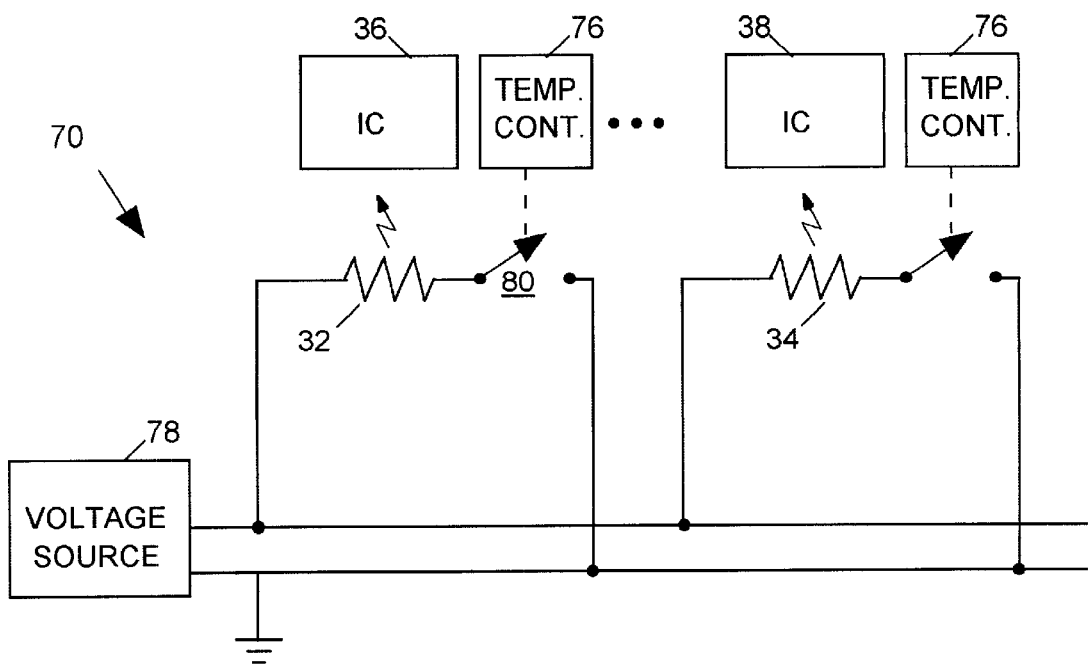

FIG. 1 is a plan view of parts mounted on the upper surface of a circuit board in accordance with the present invention, FIGS. 2 and 3 are partial sectional elevation views of the parts and circuit board of FIG. 1, FIG. 4 is a plan view of the upper surface of the circuit board of FIG. 1 with the parts removed, FIG. 5 is a plan view of heating elements of the circuit board of FIG. 1, FIG. 6 is a partial sectional elevation view of the circuit board of FIG. 1 when the circuit board is double-sided;

FIG. 7 is a plan view of parts mounted on the upper surface of a circuit board in accordance with the present invention, FIGS. 8 and 9 are partial sectional elevation views of the parts and circuit board of FIG. 7, FIG. 10 is a plan view of the upper surface of the circuit board of FIG. 7 with the parts removed, FIG. 11 is a plan view of a heating grid of the circuit board of FIG. 7, and FIG. 12 is an electrical block diagram of an apparatus in accordance with the invention for controlling the temperature of ICs mounted on the circuit board of FIG. 6.

DESCRIPTION OF THE PREFERRED EMBODIMENT(S)

Single-sided Circuit Board

FIGS. 1–5 illustrate a single-sided printed circuit board 10 including embedded heating elements 12A and 12B in accordance with the present invention. Heating elements 12A/12B generate heat that may be used for melting solder attaching parts 14 to printed circuit traces or pads 16A or 16B on the surface of circuit board 10 either when the parts are to be mounted on or removed from the circuit board. Parts 14 can include a quad flat-pack integrated circuit (IC) package 14A or a ball-grid IC package 14B as shown in FIGS. 1–3 or any other kind of IC package or component that can be soldered to the surface of an IC board such as for example IC sockets, cable connectors, heat sinks and other devices. Heating elements 12A/12B, made of material such as copper nichrome that generates substantial heat when it conducts current, reside between an insulating planar upper layer 15 and an insulating planar lower layer 17 of circuit board 10. Upper and lower layers 15 and 17 are suitably made of glass epoxy, ceramic or other electrical insulating circuit board substrate materials that can withstand temperatures sufficiently high to melt solder. Heating element 12A resides below pads 16A for receiving terminals 18A of quad flat-pack IC package 14A while a heating element 12B resides under pads 16B for receiving terminals 18B on the underside of ball-grid IC package 14B.

To melt solder deposited on the underside on terminals 18A of IC package 14A and contacting circuit board 10, we apply a voltage pulse from any suitable external voltage source (not shown) across heating element 12A through vias 20A and 21A conductively linking opposite ends of heating element 12A to the upper surface of circuit board 10. The voltage pulse sends a current pulse through heating element 12A between vias 20A and 21A causing heating element 12A to generate heat. When the current pulse is of sufficient magnitude and duration, the generated heat travels upward through upper layer 15 and melts solder under package terminals 18A. The heat pulse generated by heating element 12A can be used to melt solder when either removing part 14A from circuit board 10 or installing it thereon. A pair of vias 20B and 21B similarly linking heating element 12B to the upper surface of circuit board 10 allow the external voltage source to apply a voltage pulse across heating element 12B causing that heating element to generate sufficient heat to melt solder deposited on terminals 18B of IC 14B. Thus each heating element 12A or 12b can selectively supply heat to melt solder for connecting a corresponding part 14A or 14B to upper layer 15 without unduly heating the part or melting solder of nearby parts.

When part 14A or 14B can tolerate some degree of warming and is accessible to a external heating source, it is not necessary for heating elements 12A and 12B to supply all of the heat needed to melt the solder under the part's terminals 18A or 18B. Some of the necessary heat may be supplied by warming the entire circuit board 10 (for example in an oven) to a temperature that is somewhat lower than needed to melt solder. In such case heating elements 12A and 12B need be sized to generate only the small amount of additional heat needed to melt the solder under the particular part 14A or 14B to be removed or installed. Alternatively when a part 14A or 14B is capable of conducting some, but not all of the heat needed to melt the solder connecting it to upper layer 15, some of the heat can be supplied from an external heat source applied to the top of part. The heat from the external source then travels through the part 14A or 14B to warm the solder under the part. Here again, each heating element 12A or 12B need only supply the remaining portion of the heat needed to melt the solder for the corresponding part 14A or 14B.

Double-sided Circuit Board

FIG. 6 is a partial sectional elevation view of a double-sided circuit board 24 in accordance with the invention that is generally similar to circuit board 10 of FIG. 1 except that it is adapted to allow parts to also be mounted on its under side by the inclusion of two additional layers. Circuit board 24 includes an upper insulating layer 26 a middle insulating layer 28, a lower insulating layer 30, an upper heating element 32 residing between layers 26 and 28, and a lower heating element 34 residing between layers 28 and 30. Segments of upper heating element 32 are positioned under areas of upper insulating layer 26 providing solder contact points for parts 36 mounted on the upper side of circuit board 24. Segments of lower heating element 30 are positioned above areas of lower insulating layer 30 providing solder contact points for parts 38 mounted on the under side of circuit board 24. The middle insulator 28 inhibits heat from traveling between upper heating element 32 and lower heating element 34. Segments of each heating element 32 and 34 are linked by vias (not shown) to the upper or lower surfaces of circuit board 24 so that an external source can independently supply a voltage pulse to each heating element so that they can independently supply heat to melt solder holding parts 36 and 38 to circuit board 24.

In alternative embodiments of the invention, lower insulating layer 17 of circuit board 10 (FIG. 2) or central insulating layer 28 (FIG. 6) may be replaced by multiple circuit board layers including, for example, various ground plane, signal routing and insulating layers.

Circuit Board with Embedded Heating Grid

FIGS. 7–11 illustrates a circuit board 40, an alternative embodiment of the invention having many features in common with circuit board 10 of FIGS. 1–5. However circuit board 40 implements its heating elements in a different manner.

Circuit board 40 includes a heating grid 49 residing between upper and lower insulating layers 44 and 46. Terminals 48 of parts 50 are soldered to contacts 60 on the upper surface of layer 44. Heating grid 49 is formed by orthogonal lines 54 of material such as copper nichrome for producing substantial heat when conducting current. Conductors 62 formed along opposing edges of circuit board 40 are connected to opposing edges of the heating grid 49. When an external power supply (not shown) applies a voltage pulse across conductors 62, current pulses pass through all lines 54 of heating grid 49. When the current pulses are of sufficient magnitude and duration, heating grid 49 produces enough heat to temporarily melt solder connecting all parts 50 and contacts 60 on upper insulating layer 44 so that parts 50 may be either bonded to or removed from circuit board 40. The dimensions of portions of lines 54 can be adjusted to alter their resistivity thereby to increase or decrease heat generation in selected areas of circuit board 40. Various lines 54 may also be cut to block heat generation in various areas of the circuit board.

Heating grid 49 also includes a set of conductive contacts 56 each spanning several horizontal or vertical lines 54. Opposing pairs of contacts 56 define opposite edges of individual heating elements 58 (i.e. separate areas of heating grid 49) lying under terminals 48 of separate parts 50. Each contact 56 is conductively linked to the upper surface of upper layer 44 by a separate via 64. When an external power supply applies a voltage pulse across vias 64 connected to a pair of contacts 56 along edges of a heating element 58 under terminals 48 of one part 50, only that heating element 58 conducts substantial current and produces heat sufficient to melt solder there above. Accordingly we can melt the solder attaching any desired part 50 to upper layer 44 by applying a voltage pulse of sufficient magnitude and duration across an appropriate pair of vias 64.

Heating grid 49 can be used as a ground plane when not generating heat. Spaces 66 between lines 54 are available for routing conventional signal vias 68 through heating grid 49 between upper layer 44 and lower layer 46. Grid lines 54 can be deformed when necessary to provide additional clearance for large signal vias.

It should be understood that circuit board 40 could be converted into a double-sided circuit board by adding a lower heating element and a lower insulating layer in an manner analogous to the manner in which single-sided circuit board 10 illustrated in FIG. 2 can be converted into the double-sided circuit board 24 illustrated in FIG. 6. In such case the two heating element grids can provide substantial shielding between devices mounted on the top and bottom of the two circuit boards.

IC Temperature Regulation

The operating speed of transistors in an IC implemented in complementary metal-oxide semiconductor (CMOS) technology or other semiconductor technologies is highly dependent on the operating temperature of the IC. Therefore in order to stabilize the operating speed of a CMOS or other IC it has been known to monitor the temperature of an IC, the switching speed of transistors implemented on the IC, or the ambient temperature of air near the IC, and to control the amount of heat a heat source provides to the IC so as to maintain the IC's temperature at a constant level. However prior art systems for doing this have relied on bulky and expensive external heaters to supply the heat to the IC. In accordance with the invention, heating elements 12A and 12B of FIGS. 2 and 3 or heating elements 58 of FIG. 11 may also used as heat sources to control the operating temperature of the integrated circuit parts 14A, 14B or 50 mounted there above.

FIG. 12 is a block diagram illustrating a system 70 using circuit board 24 of FIG. 6 for regulating the temperatures of several IC's 36 or 38 mounted on the circuit board. A separate temperature controller 76 monitors the temperature of each IC 36 and closes a switch to connect a voltage source 78 across the heating element 32 or 36 under or above the IC when the IC's temperature falls below a minimum level, thereby causing the heater to warm the IC. When the monitored temperature rises, above a maximum level, temperature sensor 76 opens switch 80 to disconnect the heating element 32 from voltage source 78. The maximum temperature level may be higher than or the same as the minimum temperature level. The heat provided by heating elements 32 helps keep ICs 36 and 38 within a limited range not much wider than the range between the minimum and maximum temperature level, provided the normal operating temperature of ICs 36 and 38 remains below the maximum level when the heating elements 32 supply no heat to the IC. Temperature regulation circuits capable of carrying out the functions of temperature controller 76, voltage source 78, and switch 80 are well-known and have been used to drive other types of heaters for regulating IC temperature and are therefore not further detailed herein. Heating elements 32, 34 embedded in the circuit board are preferable to other types of IC heaters in that they are inexpensive to implement and require very little space. Also the same embedded heating elements 32 and 34 used to regulate IC temperature can be used to melt solder attaching the IC to the circuit board.

Adhesive Curing or Releasing

In some applications, parts such as integrated circuit packages, heat sinks and connectors are attached to circuit boards by adhesives including thermal releasing adhesives and electrically conductive adhesives such as silver epoxy. When the adhesive used to glue a part to a circuit board is of the type which substantially weakens its bond when heated ("thermal-releasing" adhesive), the heat generated by heating elements embedded in the circuit board such as elements 12, 32, 34 or 58 illustrated in FIGS. 2, 6 or 8 can be used to weaken adhesive bonds when such parts are to be removed from a circuit board. When curing of an adhesive such as silver epoxy requires or is facilitated by heat, the embedded heating elements 12, 32, 34 or 58 can be used to deliver the curing heat to the adhesive.

Heat Stress Testing

The heat generated by heating elements 12, 32, 34 or 48 illustrated in FIGS. 2, 6 or 8 can also be used to provide heat for heat stress testing parts mounted on the circuit boards.

Thus has been shown and described a circuit board in accordance with the invention including heating elements that may be employed for independently melting solder connecting selected parts to the circuit board, for regulating the temperature of the parts, for heating thermal releasing glue attaching parts to the circuit board, and/or for heat stress testing the parts. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for holding and regulating a temperature of a first integrated circuit (IC) package (36) and a second IC package (38), the apparatus comprising:

a substrate (26,28,30) having an upper surface upon which said first IC package is mounted, said substrate comprising electrically insulating material;

a first heating element (32) embedded in said substrate below said first IC package for generating first heat in response to a voltage applied to said first heating element, said first heat traveling through said substrate to said first IC package and warming said first IC package, and temperature regulation means (76, 78, 80) for monitoring a first temperature of said first IC package and for applying said voltage across said first heating element when said temperature falls below a first minimum level and for removing said voltage from said first heating element when said first temperature rises above a first maximum level, wherein said first maximum level is at least as high as said first minimum level.

2. The apparatus in accordance with claim 1 wherein said first heating element comprises copper nichrome.

3. The apparatus in accordance with claim 1 wherein said temperature is an ambient temperature proximate to said first integrated circuit package.

4. The apparatus in accordance with claim 1 wherein said substrate comprises:

an upper layer (26) having said upper surface, and a second layer (28), wherein said first heating element resides between said upper layer and said second layer.

5. The apparatus in accordance with claim 4 wherein said substrate further comprises a lower surface upon which said second IC package is mounted;

wherein said apparatus further comprises a second heating element (34) embedded in said substrate above said second IC package for generating second heat in response to a second voltage applied thereto, said second heat traveling through said substrate to warm second IC package; and wherein said temperature regulation means also monitors a second temperature of said second IC package and applies said voltage across said second heating element when said second temperature falls below a second minimum level and removes said voltage from said second heating element when said second temperature rises above a second maximum level wherein said second maximum level is at least as high as said second minimum level.

6. The apparatus in accordance with claim 5 wherein said substrate thermally and electrically insulates said first and second heating elements from one another.

7. The apparatus in accordance with claim 1 further comprising solder between said first IC package and said substrate, wherein said apparatus comprises means (64) for delivering a voltage pulse across said first heating element, and wherein said first heating element responds to said voltage pulse by generating substantial heat traveling to said first IC package through said substrate and melting said first solder.

8. A self-heating circuit board for holding a plurality of integrated circuit (IC) packages (50) board comprising:

a substrate (44, 46) having an upper surface upon which said IC packages are mounted, said substrate comprising an electrically insulating material;

a grid (49) of heating conductors (54) embedded in said substrate below said IC packages for generating substantial heat in response to a voltage applied to said grid, said heat traveling through said substrate to said integrated packages;

a plurality of conductive contacts (56), wherein each conductive contact contacts the grid, and wherein separate areas (58) of said grid reside between corresponding pairs of said contacts and under corresponding ones of said IC packages; and means for delivering separate voltage pulses across each of said separate pairs of said contacts.

9. The self-heating circuit board in accordance with claim 8 wherein each said area of said grid temporarily generates heat in response to the voltage delivered across its corresponding pair of contacts, and wherein said heat travels to the IC package corresponding to said area of said grid via said substrate.

10. The self-heating circuit board in accordance with claim 8 wherein each of said IC packages includes solder contacting said substrate and wherein the heat generated by each of said areas of said grid melts the solder-included in its corresponding IC package.

11. The self-heating circuit board in accordance with claim 8 wherein said means for delivering separate voltage pulses across each of said separate pairs of said contacts supplies a voltage pulse across each pair of said contacts whenever a temperature proximate to the corresponding IC package falls below a predetermined minimum temperature.

12. A method for mounting integrated circuit packages on corresponding areas of a surface of a circuit board and controlling their temperatures, comprising the steps of:

embedding a separate heating element corresponding to each of said areas in the circuit board proximate to its corresponding area, each heating element being of a type which generates heat in response to an applied voltage pulse, said heat flowing through said circuit board to the corresponding area, positioning solder between each integrated circuit package and its corresponding area, applying a first voltage pulse to each heating element of sufficient magnitude and duration to cause each heating element to generate enough heat to temporarily melt the solder between its corresponding area and the area's corresponding integrated circuit package, and thereafter applying a second voltage pulse to each said heating element when a temperature near an integrated circuit package corresponding to the heating element's corresponding area falls below a predetermined minimum level.

* * * * *